US008728390B2

(12) United States Patent
Wang

(10) Patent No.: US 8,728,390 B2
(45) Date of Patent: *May 20, 2014

(54) VIBRATION MACHINES FOR POWDER COATING

(75) Inventor: Yucong Wang, West Bloomfield, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/439,321

(22) Filed: Apr. 4, 2012

(65) Prior Publication Data

US 2013/0266471 A1    Oct. 10, 2013

(51) Int. Cl.
*H01F 41/02* (2006.01)
*B22F 1/02* (2006.01)

(52) U.S. Cl.
USPC .................................. 419/35; 419/64; 419/28

(58) Field of Classification Search
USPC ................................................ 419/35, 28, 64
See application file for complete search history.

(56) References Cited

U.S. PATENT DOCUMENTS

| 5,397,530 A * | 3/1995 | Narasimhan et al. ............. 419/1 |
| 2007/0167314 A1 * | 7/2007 | Katori et al. .................. 502/101 |
| 2010/0145143 A1 * | 6/2010 | Salomon et al. ............. 600/104 |
| 2012/0182102 A1 | 7/2012 | Wang |

OTHER PUBLICATIONS

Akhtar et al. "Development of NdFeB Magnet through Hydrogen Decrepitation", Key Engineering Materials, 442, 2010, 263-267.*
Choi et al. "Improvement of the Magnetic Properties of Nd2Fe14B Powders by Dysprosium Diffusion", Rev. Adv. Mater. Sci. 28, 2011, 134-140.*
Rodewald, W., "Magnetization and Aging of Sintered Nd-Fe-B Magnets," J. of the Less-Common Metals, 111 (1985) pp. 77-81.
Plusa, D. et al., "Domain Structure and Domain-Wall Energy in Polycrystalline R2Fe14B Compounds (R=Pr, Nd, Gd, Dy)," J. of the Less-Common Metals, 133 (1987), pp. 231-243.
Herget, C.S., "Metallurgical Methods for the Production of Rate Earth-Transition Metal Permanent Magnet Materials," MPR, v. 42, Jun. 1987, pp. 438-444.

* cited by examiner

*Primary Examiner* — Rebecca Lee
(74) *Attorney, Agent, or Firm* — Brooks Kushman P.C.

(57) ABSTRACT

A method of making a permanent magnet includes a step of forming a coating on an alloy powder by physical vapor deposition. The alloy powder includes neodymium, iron, boron and other metals. The coating includes a component selected from the group consisting of dysprosium, terbium, iron, and the alloys thereof. The alloy powder is vibrated during formation of the coating. Finally, a permanent magnet is formed from the coated powder, the permanent magnet having a non-uniform distribution of dysprosium and/or terbium. A method of making a permanent magnet using a vibrating transport belt is also provided.

19 Claims, 3 Drawing Sheets

VIBRATION MACHINES FOR POWDER COATING

FIELD OF THE INVENTION

In at least one aspect, the present invention relates to an alloy coating powder for making permanent magnets with improved magnetic properties and reduced use of dysprosium and/or terbium. In particular, the present invention relates to improved and less expensive methods of making coated powders for producing permanent magnets

BACKGROUND

Permanent magnets (PMs) are used in a variety of devices, including traction electric motors for hybrid and electric vehicles. Sintered neodymium-iron-boron (Nd—Fe—B) permanent magnets have very good magnetic properties at low temperatures. However, due to the low Curie temperature of the $Nd_2Fe_{14}B$ phase in Nd—Fe—B permanent magnets, the magnetic remanence and intrinsic coercivity decrease rapidly with increased temperature. It is known that the substitution of Dy for Nd or Fe in Nd—Fe—B magnets results in increases of the anisotropic field and the intrinsic coercivity, and a decrease of the saturation magnetization (C. S. Herget, Metal, Poed. Rep. V. 42, P. 438 (1987); W. Rodewald, J. Less-Common Met., V111, P77 (1985); and D. Plusa, J. J. Wystocki, Less-Common Met. V. 133, P. 231 (1987)). It is a common practice to add the heavy RE metals such as dysprosium (Dy) or terbium (Tb) into the mixed metals before melting and alloying. However, Dy and Tb are very rare and expensive. Heavy REs contain only about 2-7% Dy, and only a small fraction of the RE mines in the world contain heavy REs. The price of Dy has increased sharply in recent times. Tb, which is needed if higher magnetic properties are required than Dy can provide, is much more expensive than even Dy.

Typical magnets for traction electric motors in hybrid vehicles contain about 6-10 wt % Dy to meet the required magnetic properties. Conventional methods of making magnets with Dy or Tb result in the Dy or Tb being distributed in the grains and in the phases along grain boundaries within the magnet. Nd—Fe—B permanent magnets can be produced using a powder metallurgy process, which involves melting and strip casting, hydrogen decrepitation (hydride and dehydride), pulverizing (with nitrogen jet milling), screening, and mixing alloy powders for the desired chemical composition. A typical powder metallurgy process is as follows: weighing and pressing under a magnetic field for powder alignment (vacuum bagging), isostatic pressing, sintering and aging (e.g., about 5-30 hrs, at about 500-1100 C, in vacuum), and machining to magnet pieces. Finally, the magnets are surface treated by phosphating, electroless nickel (Ni) plating, epoxy coating, or the like (if needed).

The ideal microstructure for sintered Nd—Fe—B based magnets is $Fe_{14}Nd_2B$ grains perfectly isolated by the nonferromagnetic Nd-rich phases (a eutectic matrix of mainly Nd plus some $Fe_4Nd_{1.1}B_4$ and Fe—Nd phases stabilized by impurities). The addition of Dy or Tb leads to the formation of quite different ternary intergranular phases based on Fe, Nd and Dy or Tb. These phases are located in the grain boundary region and at the surface of the $Fe_{14}Nd_2B$ grains.

Dy or Tb (or their alloys) coated Nd—Fe—B powders are used to make the magnet, which results in a non-uniform distribution of Dy or Tb in the magnet microscopically. For example, the amount of Dy and/or Tb can be reduced by about 20% or more compared to conventional processes, or about 30% or more, or about 40% or more, or about 50% or more, or about 60% or more, or about 70% or more, or about 80% or more, or about 90% or more, depending on relative amount of surface powder to core powder and the Dy or Ty concentration in the surface powder, sintering schedule (which affects diffusion of Dy or Ty into the bulk from grain surface). The process involves coating the Nd—Fe—B based powder used to make sintered Nd—Fe—B permanent magnets with Dy or Tb metals or alloys. The Nd—Fe—B based powder can be coated via physical vapor deposition (PVD).

Accordingly, there is a need for improved methods of making permanent magnets, and in particular, Nd—Fe—B based magnets.

SUMMARY OF THE INVENTION

The present invention solves one or more problems of the prior art by providing in at least one embodiment, a method of making a permanent magnet. The method includes a step of forming a coating on an alloy powder by physical vapor deposition. The powder includes neodymium, iron, boron and other metals. The coating includes a component selected from the group consisting of dysprosium, terbium, iron, and the alloys thereof. The powder is vibrated during formation of the coating. Finally, a permanent magnet is formed from the coated powder, the permanent magnet having a non-uniform distribution of dysprosium and/or terbium.

In another embodiment, a method of making a permanent magnet is provided. The method comprises providing an alloy powder comprising neodymium, iron, and boron. The alloy powder is transported from a high level belt to a middle level belt and then to a low level belt. The middle level belt is vibrated so that the alloy powder is also vibrated. A coating is formed on the alloy powder by physical vapor deposition to form a coated powder. The coating includes a component selected from the group consisting of dysprosium, terbium, iron, and other metals and alloys thereof. A permanent magnet is formed from the coated powder. Characteristically, the permanent magnet has a non-uniform distribution of dysprosium and/or terbium.

BRIEF DESCRIPTION OF THE DRAWINGS

Exemplary embodiments of the present invention will become more fully understood from the detailed description and the accompanying drawings, wherein.

DESCRIPTION OF THE INVENTION

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

Figure 1:
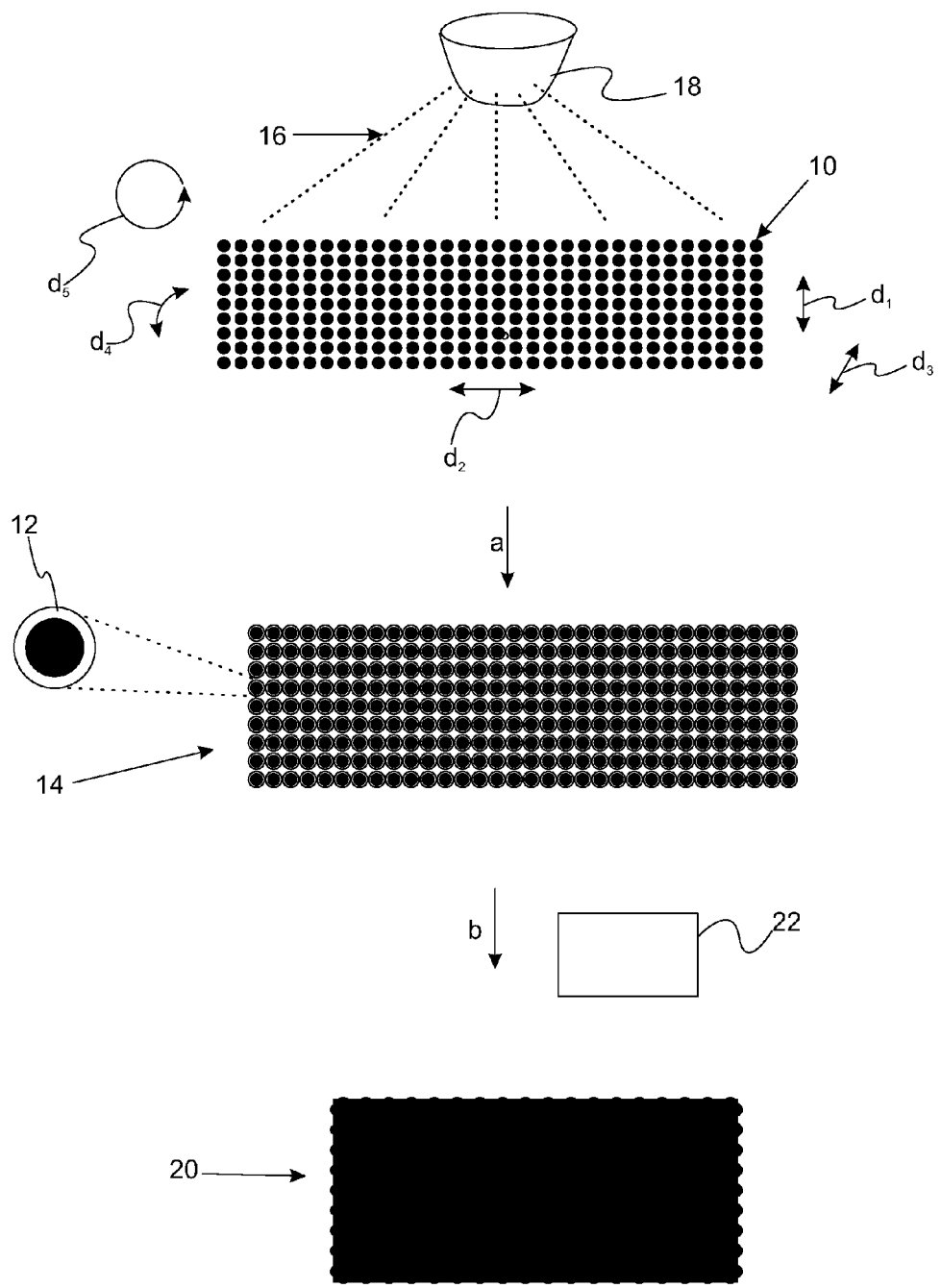
FIG. 1 is a schematic flowchart of a method form making a permanent magnet.
Figure 2:
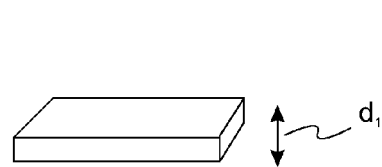
FIG. 2 provides an illustration of a substrate being linearly vibrated in a vertical direction.
Figure 3:
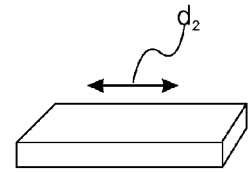
FIG. 3 provides an illustration of a substrate being linearly vibrated in a horizontal direction.
Figure 4:
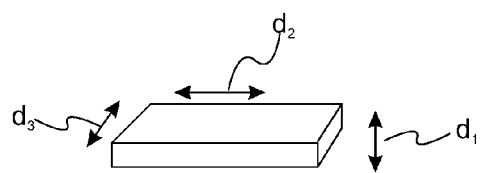
FIG. 4 provides an illustration of a substrate being linearly vibrated in a vertical direction and linearly vibrated in at least one horizontal direction.
Figure 5:
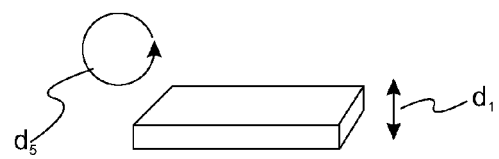
FIG. 5 provides an illustration of a substrate being circularly vibrated and linearly vibrated in a vertical direction.
Figure 6:
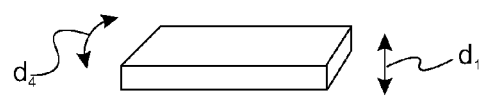
FIG. 6 provides an illustration of a substrate being oscillated along a horizontal direction and linearly vibrated along a vertical direction.

With reference to FIG. 1, a flow chart illustrating a method of making a permanent magnet is provided. The method comprises coating alloy powder 10. In particular, coating 12 is formed on alloy powder 10 by physical vapor deposition (PVD) to form coated powder 14 in step a). Examples of PVD processes that may be used include, but are not limited to, sputtering, evaporation, electron beam evaporation, cathodic arc deposition, pulsed laser deposition, and the like. FIG. 1 illustrates an example using evaporation in which coating material 16 is evaporated from an evaporation target 18 by bombarding the target with nitrogen or argon ions. Typically, such heating is accomplished by resistive heating. Powder alloy 10 includes neodymium, iron, boron, and other metals, and alloys thereof. Characteristically, coating 12 includes a component selected from the group consisting of dysprosium, terbium, iron, and alloys thereof. Alloy powder 10 is vibrated during formation of the coating. Such vibration is achieved by movement of alloy powder 10 along one or more of directions $d_1$, $d_2$, $d_3$, $d_4$, and $d_5$. Moreover, such motion that vibrates the powders includes linear vibrations (directions $d_1$, $d_2$, $d_3$), "see-saw" oscillatory motions (direction $d_4$), and circular oscillations (direction). In step b), permanent magnet 20 is subsequently formed from the coated powder. In a refinement, the coated powder is shaped by placing alloy powder 10 into mold 22. Additional details of the formation and shaping of the alloy powder are set forth below.

U.S. application Ser. No. 13/007,203, filed Jan. 14, 2011, entitled Method Of Making Nd—Fe—B Sintered Magnets With Dy Or Tb describes magnets and methods of making such magnets using much less Dy or Tb than those made using the conventional methods while obtaining similar magnetic properties by coating the core magnetic powder particles with a Dy or Tb rich coating via physical vapor deposition. The entire disclosure of this patent application is hereby incorporated by reference. The current invention is an improvement over this patent application and provides new methods of producing evenly coated magnetic powders via physical vapor deposition. Moreover, this patent provides additional information on how to make magnets from powders that may be applied to the present invention.

Characteristically, the permanent magnet of the present embodiment has a non-uniform distribution of dysprosium and/or terbium. For example, in one refinement, the permanent magnet includes regions in which neodymium, iron, and boron magnetic domains are coated with a layer including dysprosium and/or terbium. In a refinement, the coating has a thickness from about 10 nm to about 50 microns. In another refinement, the coating has a thickness from about 50 nm to about 5 microns. In still another refinement, the coating has a thickness from about 100 nm to about 3 microns. In a refinement, the coated powder is shaped by placing the alloy powder 10 into mold 22. The alloy powder 10 is usually pressed under a magnetic field. Typically, a permanent magnet includes from about 0.01 to about 8 weight percent dysprosium and/or terbium of the total weight of the permanent magnet. However, the surface concentration of dysprosium and/or terbium may be from about 3 to about 50 weight percent of the total weight of the coating layer.

Magnets made using the present process use considerably less Dy or Tb than those made using conventional prior art methods while obtaining similar magnetic properties. In the present process, the Dy or Tb coated Nb—Fe—B powders are used to make a magnet that has a much higher distribution of Dy or Tb in grain boundaries, which can be seen and measured using a scanning electron microscope with a microprobe. Conventional methods employ Nb—Fe—B powders with Dy or Tb as alloying elements where typically, the Dy or Tb is uniformly distributed microscopically. The present invention utilizes a non-uniform distribution of these elements which enables the present process to use much less Dy or Tb for the similar magnetic properties. For example, the amount of Dy and/or Tb can be reduced by about 20% or more compared to conventional processes, or about 30% or more, or about 40% or more, or about 50% or more, or about 60% or more, or about 70% or more, or about 80% or more, or about 90% or more.

As set forth above, the coating process of the present embodiment allows the average Dy or Tb concentration to be reduced and changes the distribution of the Dy or Tb in the magnet. The average Dy or Tb concentration can be in a range of about 0.1 to about 5 wt %, or about 0.3 to about 4 wt %, or about 0.3 to about 3 wt %, compared with about 6-9 wt % for traditional magnets having similar high magnetic properties. The coating process creates powder particles with a Dy or Tb surface concentration as high as about 3 to about 50 wt. % or more, and a low Dy or Tb bulk concentration. In this context, surface concentration refers to the weight percent of Dy and/or Tb in the layer coating the alloy powder. The coating process is introduced into the current preparation for the powder metallurgy process as an extra step.

In a variation of the present embodiment, the alloy powder is formed as follows. An alloy containing neodymium, iron, and boron is melted and cast via spinning to make strips. The alloy strips are then hydrogen decrepitated by hydrogenating the alloy. Typically, this step is accomplished in a hydrogen furnace at a pressure of approximately 1 to 5 atm until the alloy is deprecated. The alloy is then typically dehydrogenated in a vacuum at elevated temperature (e.g., 300 to 600° C.) for 1 to 10 hours. The result of the hydrogenation and dehydrogenation is that the alloy is decrepitated into a coarse powder typically with an average particle size from 0.1 mm to 5 mm. The coarse powder is then pulverized (by nitrogen jet milling) to make a starting powder. In a refinement, the alloy powder may be optionally screened and then be mixed with a second alloy powder in order to adjust the chemical composition. The alloy powder is then coated by a physical vapor deposition process with a Dy and/or Tb containing layer. The powders are vibrated during coating as set forth above. The resulting coated powder may then be optionally screened again.

In another variation of the present embodiment, the coated powder is formed into a permanent magnet. In one refinement, magnets are formed by a powder metallurgy process. Such processes typically involve weighing and pressing under a magnetic field (vacuum bagging), isostatic pressing or shock compaction for higher green density, sintering in a mold and aging (e.g., about 30 hrs, at about 1100° C., in vacuum) and machining to magnet pieces. Finally, the magnets are usually surface treated (e.g., phosphate, electroless nickel plating, epoxy coating, etc.).

The present invention involves several different types of vibration for producing evenly coated powders. The vibration machines illustrated in FIGS. 2-6 are particularly useful for low volume batch production. In one variation as set forth in FIG. 2, the alloy powder is linearly vibrated along a vertical direction $d_1$. The vibration in this variation is in a single vertical direction. In another variation as set forth in FIG. 3, the alloy powder is vibrated along a horizontal direction $d_2$. The vibration in this variation is in a single horizontal direction. In another variation as set forth in FIG. 4, the powder alloy is linearly vibrated along a vertical direction $d_1$ and at least one of horizontal directions $d_2$ and $d_3$. The vibration of this variation can be a three-dimensional vibrating motion when two horizontal motions are used. An oscillatory vibration machine of this variation provides a see-saw motion. A side-alternating vibration is an important component to improving coating evenness. In another variation as set forth in FIG. 5, the powder alloy is circularly vibrated along a horizontal direction $d_5$ and linearly vibrated along a vertical direction $d_1$. In this variation, a three-dimensional vibrating motion is a combination of a horizontal rotary motion (clockwise or counter clockwise) and a vertical vibration motion. In still another variation as set forth in FIG. 6, the alloy powder is oscillated along a horizontal direction $d_4$ and linearly vibrated along a vertical direction $d_1$. In this variation a three-dimensional vibrating motion combines a circular oscillating motion with a vertical vibrating motion. It should be appreciated that a vertical circular oscillating motion can also be used here.

As set forth above vibrating machines using vibrating motors may be used as vibration sources. The motors can be installed to provide upper vibration or side vibration. Damping devices can be installed in a suspension form. For example, damping springs (e.g. steel springs) may be used for this purpose. The vibrations set forth in FIGS. 2-6 are characterized by a power from 1 to 4000 kilowatts, a vibrating frequency of 5 to 50 Hz, and amplitude of 0.5 to 5 mm.

Figure 7:
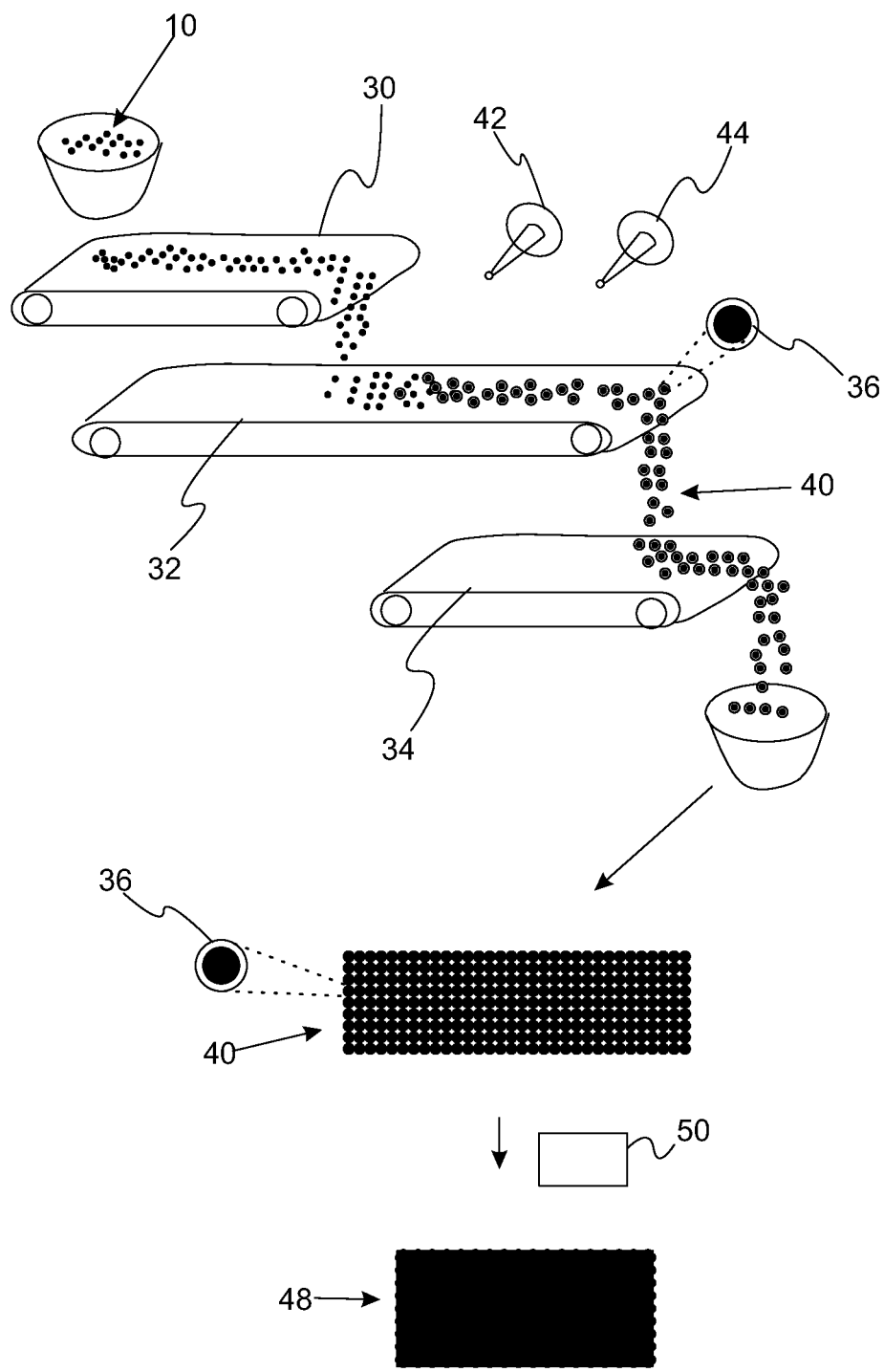
FIG. 7 is a schematic illustrating a continuous production method for forming a permanent magnet.

With reference to FIG. 7, a schematic illustrating a continuous production method for forming a permanent magnet is provided. The method comprises providing alloy powder 10 comprising neodymium, iron, and boron from a top container. Alloy powder 10 is transported from high level belt 30 to middle level belt 32 and then to low level belt 34. Optionally, high level belt 30 is vibrated to ensure even powder transportation (with one of the motions set forth in FIGS. 2-6). Middle level belt 32 is vibrated with one of the motions set forth in FIGS. 2-6 such that the alloy powder 10 is also vibrated in this manner for an even coating. The vibrations of the present variation are characterized by a power from 1 to 4000 kilowatts, a vibrating frequency of 5 to 50 Hz, a surface inclination for all the belts of 0 to 15 degrees, a coating surface area of 0 to 1000 $cm^2$, a capacity of 10 to 500 kg powder/hour, and an amplitude of 0.5-5 mm. Coating 36 is formed on alloy powder 10 by physical vapor deposition to form coated powder 40. Evaporation sources 42 and 44 are used for this purpose. A voltage bias is applied between evaporation sources and the middle belt for improved coating efficiency. Characteristically, coating 36 includes a component selected from the group consisting of dysprosium, terbium, iron, and other metals, and alloys thereof. All the transportation and coating devices of the present embodiment are positioned inside a vacuum container, as required by physical vapor deposition. Alloy powder 10 and coated powder 40 can be delivered into and out of a coating machine via separate interlock vacuum chambers. Permanent magnet 48 is formed from coated powder 40 using mold 50 as set forth above. Characteristically, the permanent magnet has a non-uniform distribution of dysprosium and/or terbium.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of making a magnet, the method comprising:
   forming a coating on an alloy powder by physical vapor deposition to form a coated powder, the alloy powder comprising neodymium, iron, boron and other metals, the coating comprising a component selected from the group consisting of dysprosium, terbium, iron, and alloys thereof;
   vibrating the alloy powder during formation of the coating; and
   forming a permanent magnet from the coated powder, the permanent magnet having a non-uniform distribution of dysprosium and/or terbium such that the permanent magnet includes from about 0.01 to about 8 weight percent dysprosium and/or terbium of the total weight of the permanent magnet and a surface concentration of dysprosium and/or terbium is from about 3 to about 50 weight percent of the total weight of the coating layer.

2. The method of claim 1 wherein the permanent magnet includes regions in which neodymium, iron, and boron magnetic domains are coated with a layer including dysprosium and/or terbium.

3. The method of claim 2 wherein the layer has a thickness from about 10 nm to about 50 microns.

4. The method of claim 1 wherein the alloy powder is linearly vibrated along a vertical direction.

5. The method of claim 1 wherein the alloy powder is vibrated along a horizontal direction.

6. The method of claim 1 wherein the alloy powder is linearly vibrated along at least a horizontal direction and along a vertical direction.

7. The method of claim 1 wherein the alloy powder is circularly vibrated along a horizontal direction and linearly vibrated along a vertical direction.

8. The method of claim 1 wherein the alloy powder is oscillated along a horizontal direction and linearly vibrated along a vertical direction.

9. The method of claim 1 wherein the permanent magnet is formed using a powder metallurgy process.

10. The method of claim 9 wherein the alloy powder is shaped by placing the alloy powder into a mold.

11. The method of claim 9 wherein the alloy powder is pressed under a magnetic field during shaping, and optionally, isostatically pressed or shock compacted for a higher green density.

12. The method of claim 11 wherein the alloy powder is sintered after pressing.

13. The method of claim 1 wherein the alloy powder is hydrogen decrepitated.

14. A method of making a magnet, the method comprising:
providing an alloy powder comprising neodymium, iron, and boron;
transporting the alloy powder from a high level belt to a middle level belt and then to a low level belt, the high and middle level belts being oscillated for vibrating the powder;
forming a coating on the alloy powder by physical vapor deposition to form a coated powder, the coating comprising a component selected from the group consisting of dysprosium, terbium, iron, and other metals and alloys thereof; and
forming a permanent magnet from the coated powder, the permanent magnet having a non-uniform distribution of dysprosium and/or terbium such that the permanent magnet includes from about 0.01 to about 8 weight percent dysprosium and/or terbium of the total weight of the permanent magnet and a surface concentration of dysprosium and/or terbium is from about 3 to about 50 weight percent of the total weight of the coating layer.

15. The method of claim 14 wherein the powder is linearly vibrated along a vertical direction.

16. The method of claim 14 wherein the alloy powder is vibrated along a horizontal direction.

17. The method of claim 14 wherein the alloy powder is linearly vibrated along a horizontal direction and vertical direction.

18. The method of claim 14 wherein the alloy powder is circularly vibrated along a horizontal direction and linearly vibrated along a vertical direction.

19. The method of claim 14 wherein the alloy powder is oscillated along a horizontal direction and linearly vibrated along a vertical direction.

* * * * *